TRANSISTORIZED TUNING FORK OSCILLATOR

Filed March 31, 1958 2 Sheets-Sheet 1

INVENTOR.
BORIS F. GRIB
BY
Darby & Darby
ATTORNEYS

Dec. 31, 1963 B. F. GRIB 3,116,466

TRANSISTORIZED TUNING FORK OSCILLATOR

Filed March 31, 1958 2 Sheets-Sheet 2

INVENTOR.
BORIS F. GRIB
BY Darby & Darby
ATTORNEYS

United States Patent Office 3,116,466
Patented Dec. 31, 1963

3,116,466
TRANSISTORIZED TUNING FORK OSCILLATOR

Boris F. Grib, Huntington, N.Y., assignor to Philamon Laboratories, Inc., Long Island, N.Y., a corporation of New York Filed Mar. 31, 1958, Ser. No. 724,997
6 Claims. (Cl. 331—116)

This invention relates to oscillator circuits and more particularly to those circuits which utilize tuning fork resonators.

It always has been a particular problem to design an alternating current supply for use with equipment such as gyroscopes, servo-mechanisms and automatic control devices, that possesses the necessary frequency accuracy and stability required for proper operation of these devices. In the past, difficulty has been experienced in obtaining the required precision with the use of conventional oscillator circuits. This has been especially true in those oscillator circuits which incorporate a tuning fork resonator.

It is well known that the accuracy and stability of the output frequency produced by a tuning fork resonator, connected in a circuit to provide continued oscillations, depends not only upon the physical structure of the tuning fork but also upon the various elements connected in the oscillator circuit. Any variation of these circuit elements will result in change in the output frequency of the fork. The present invention provides novel oscillator circuits which incorporate a tuning fork resonator and serve as an extremely accurate and stable source of low frequency energy by avoiding the effects of any circuit variations. The oscillators of the present invention are particularly designed to precisely produce frequencies in the range from 200 to 2000 cycles per second. Higher frequencies can also be accurately produced if the components and tuning fork are suitably chosen.

The basic function of the elements connected in the oscillator circuit is to provide a feedback path wherein energy can be supplied to the drive circuit of the tuning fork from the output circuit of the tuning fork in such a manner as to produce a sustained state of oscillation of the fork.

More specifically, the oscillator feedback path circuitry has three purposes which are described as follows:

(1) To start the tuning fork into oscillatory motion;

(2) To supply the energy necessary to sustain the oscillation of the fork in proper phase with respect to the motion of the fork; and (3) To supply a constant amount of energy to the fork to insure that the fork will vibrate at a constant amplitude.

It is well known that the first purpose is fulfilled by all conventional and previously known oscillator circuits. However, the accuracy and stability striven for in the production of a specific frequency is primarily dependent upon the second and third purposes listed. Therefore, the degree to which they are satisfied will ultimately determine the accuracy of the system.

Using transistors it has become possible to design oscillator circuits which use a tuning fork and possess very high precision characteristics both as to frequency accuracy and stability. Utilizing the embodiments shown in this invention, accuracy in the order of one part in ten million in the production of a specified frequency has been obtained. Accordingly, it is an object of this invention to provide a precision oscillator.

Another object of this invention is to provide a source of low frequency energy which exhibits great frequency accuracy and stability.

It is still a further object of this invention to provide a novel oscillator using a tuning fork resonator in conjunction with transistor circuitry.

Yet another object of this invention is to provide an oscillator of a tuning fork type wherein the period of oscillation of the tuning fork is kept essentially constant even though changes occur in the feedback loop supplying the energy necessary for sustained tuning fork oscillation.

The present invention in its preferred form accomplishes these objects by providing a transistor, which serves as the tuning fork driver, in the path between the tuning fork drive coil and the source of energy to the drive coil. The transistor is connected in such a manner, by the use of suitable circuit components, to allow the drive coil to receive current from the current source in the proper phase and amplitude necessary to maintain an accurate and stable frequency of oscillation.

Other objects and advantages of the present invention will become more fully apparent from consideration of the following description of preferred embodiments thereof taken in conjunction with the appended drawings in which.

Figures 4, 5A:
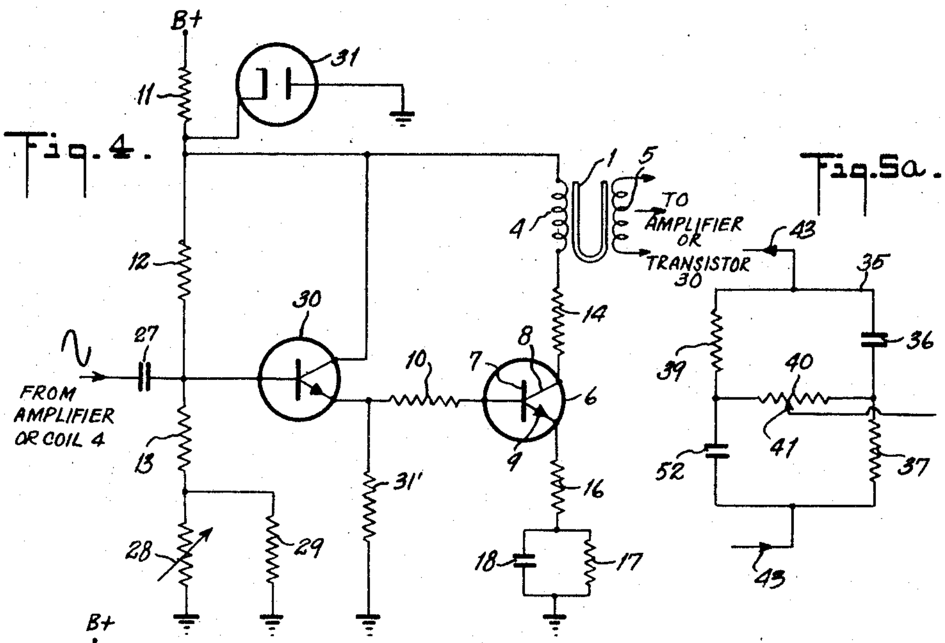
FIG. 4 shows a variation of the basic driver circuit.

FIG. 5*a* is a schematic diagram of a type of phase shift circuit useful with the present invention.

Figures 1, 2, 3:
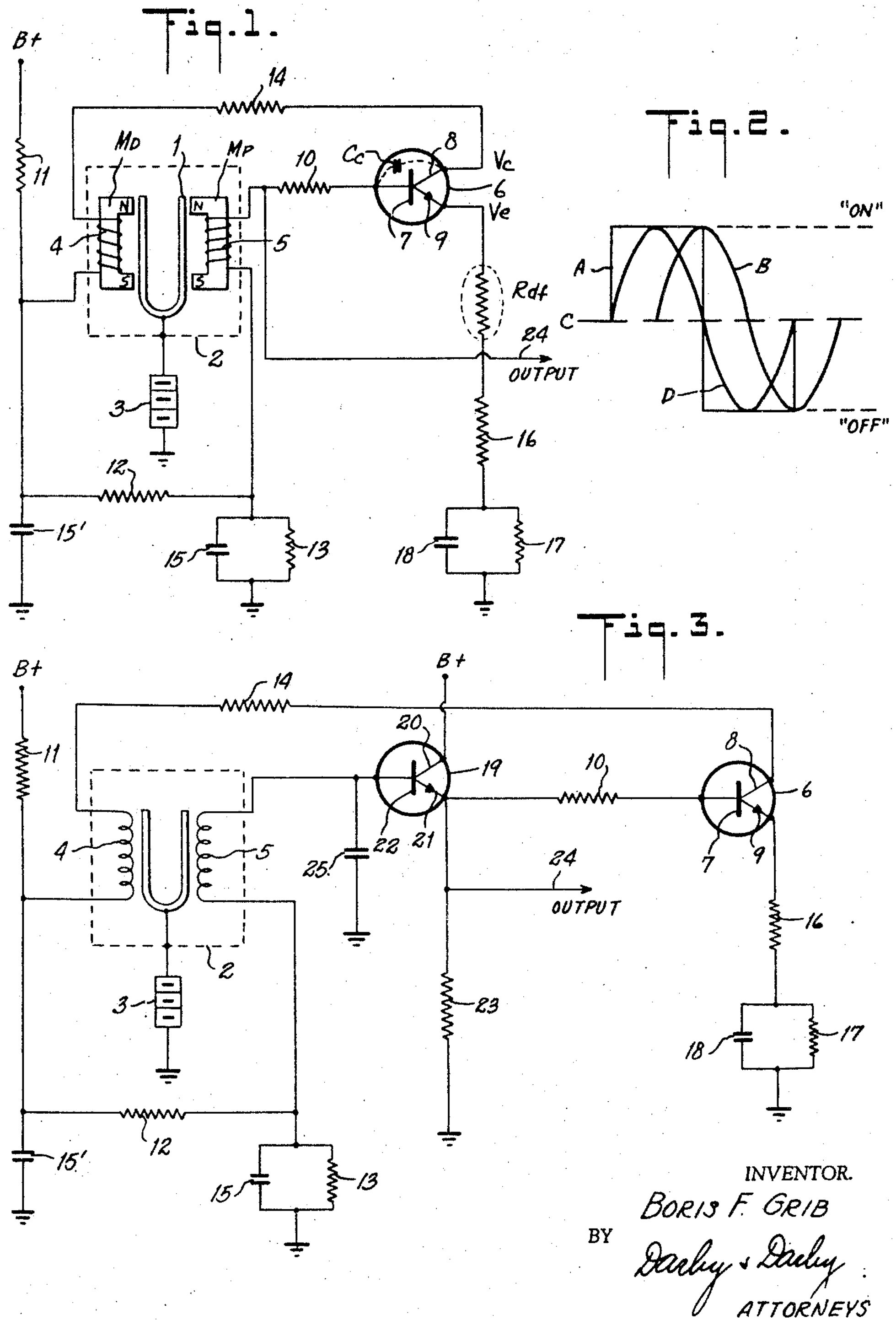
FIG. 1 shows a basic form of the invention.
FIG. 2 shows a graphical representation of the operation of the oscillator circuit.
FIG. 3 shows an additional embodiment of the invention which utilizes an amplifier.

The basic principles of the present invention will be more readily understood by reference to FIGURE 1. A tuning fork 1 is shown housed within a container designated by the dotted lines 2. The tuning fork 1 used to obtain the greatest precision for the whole system is preferably manufactured from material which has been specially treated to make it relatively insensitive to externally varying conditions, such as changes in temperature. Suitable forms of tuning fork and tuning fork resonator are described and claimed in Grib Patent No. 2,806,400 issued September 17, 1957, and Grib application Serial No. 691,615 filed October 22, 1957 for Tuning Fork Resonators. Other forks manufactured from standard material can also be utilized with this invention. Also in container 2 is drive coil 4 which is wound around a permanent magnet $M_D$. Drive coil 4 in conjunction with magnet $M_D$ serves to supply the energy necessary to keep tuning fork 1 in a sustained state of oscillation. Pickup coil 5 which is wound around permanent magnet $M_P$ is also disposed within the container 2 and derives the energy produced by tuning fork 1. Magnets $M_D$ and $M_P$ are made of "Alnico" or other suitable magnetic material. The container 2 is sealed by a suitable process to render the elements inside relatively unaffected by any external changes such as in temperature, humidity, etc. To complete the arrangement, tuning fork 1 is connected by suitable means to container 2 and the container 2 is mounted on any suitable support by a mechanical damping means such as shown diagrammatically as 3 which serves to make the entire tuning fork assembly less susceptible to mechanical shock and vibration. The mechanical features of the fork and its mounting form no part of the present invention, in which any desired fork of suitable stability may be used.

The operation of the tuning fork 1 is as follows: Drive permanent magnet $M_D$ places an initial holding force or pull upon its adjacent tine due to the residual magnetism of $M_D$. When a current flows through drive coil 4, it will either add to or subtract from the initial magnetomotive force (MMF) of magnet $M_D$ depending upon the instantaneous direction of the current flow. Pickup magnet $M_P$ and pickup coil 5 act as a variable reluctance pickup. As the tuning fork 1 vibrates, the gap between the pickup coil 5 and the tine adjacent the coil 5 changes. The change in gap width produces a resultant change in flux across the gap and thereby induces a voltage in pickup coil 5 which varies in accordance with the vibration of the tine.

The remainder of FIG. 1 is constituted by a circuit including a transistor 6 coupled between the pickup coil 5 and the drive coil 4.

When B+ is initially connected to the circuit, the inherent noise present in the transistor 6 will "shock" the fork 1 into oscillatory motion by means of incrementally varying collector current through the drive coil. The tuning fork 1 will vibrate at its natural resonant frequency, as determined by the physical construction of the tuning fork 1, and induce a voltage in pickup coil 5. This voltage is applied to driver transistor 6 and controls the current flow in the transistor collector circuit. the initial voltage present at pickup coil 5 is sufficient to start a regenerative action in the circuit comprising the transistor 6 and the drive coil 4, since, by suitable choice of circuit parameters, there will be a greater collector current flowing through drive coil 4 than is necessary to produce the resulting voltage at pickup coil 5 to control the collector current.

This regenerative process will continue until the fork amplitude reaches a value determined by the circuit parameters, as will be explained later, and then the fork vibration will be sustained at a constant rate and amplitude.

The major problem encountered after the tuning fork has reached the sustained state of oscillation is to insure that the additional current supplied to the drive coil 4 is of the proper phase and amplitude. If the amplitude of the drive current supplied to drive coil 4 changes, there will be a change in the amplitude of the fork swing which will result in a variation of the output frequency of the fork from its natural resonant frequency. For example, if the amplitude of the fork swing is increased due to an increase in the drive current, the output frequency will decrease from its natural resonant frequency since it will take the fork a longer time to go through one complete cycle of motion. To obtain maximum frequency accuracy therefore, the amplitude of the current supplied to the drive coil 4 should be kept constant.

It is also necessary that the current be supplied to the drive coil 4 in the proper phase since the phase of the current supplied to the drive coil 4 will determine how close to the true resonant frequency of the fork the actual fork vibrations will occur. It has been found that the introduction of a 45° phase lag in the circuit between pickup coil 5 and drive coil 4 will decrease the frequency of oscillation of the tuning fork 1 by a factor of ½Q from the resonant frequency. An examination of the conventional universal resonance and phase shift curves will show the frequency variations for other leading and lagging phase shifts. For a more complete explanation of this concept, reference should be had to copending Grib application Serial No. 691,624 filed October 22, 1957 for Tuning Fork Oscillator, now U.S. Patent 2,956,242, issued on October 11, 1960. It is therefore essential that there be no undesired phase shift present in the feedback circuit between the output coil 5 and the drive coil 4. One useful aspect of the phase shift concept is that suitable phase shift networks can be purposely added and thereby provide a frequency vernier control.

The circuits shown in the accompanying embodiments are constructed with the two prime prerequisites of zero (or adjustable) phase shift and of constant amplitude current in mind. Also, in all the embodiments shown the tuning fork 1 and associated elements in container 2 can be considered to operate in the same manner as described above. Therefore, only the circuits after the output of pickup coil 5 will be described.

Referring again to FIGURE 1, a transistor 6 of the NPN type is shown having a base electrode 7, collector electrode 8 and emitter electrode 9. It should be recognized that either silicon or germanium transistors of the NPN or PNP types can be used if suitable conventional modifications of the biasing voltages and circuit elements are made.

Transistor 6 is connected as a common emitter amplifier. The forward bias voltage for base 7 is developed from a suitable power supply or battery, here designated as B+, across voltage divider 11, 12 and 13 and taken across resistor 13 and a point of reference potential such as ground. This voltage is supplied to the base 7 through pickup coil 5 and resistor 10. The value of resistor 10 is chosen to prevent excess loading on pickup coil 5 and also to limit the amount of current that will flow to base 7. The reverse bias voltage for collector 8 is derived from voltage divider 11, 12, 13, and is taken off across resistors 12 and 13 to the point of reference potential. Capacitors 15 and 15' serve as A.C. bypass capacitors. The path from B+ to the collector 8 is completed through drive coil 4 and resistor 14. Resistors 16 and 17 are placed in the emitter circuit to establish the quiescent operating point of the transistor 6. Resistor 17 is bypassed by capacitor 18 and this provides essentially zero impedance to A.C. signals. Resistor 16 is unbypassed and will therefore degeneratively affect the A.C. voltage gain of the transistor. The output of the circuit is taken off via lead 24 from the junction of resistor 10 and the upper end of pickup coil 5.

The detailed analysis of the operation of the circuit shown in FIG. 1 is as follows. When B+ is applied to the circuit the inherent noise of transistor 6 will slightly shock the tuning fork 1 into oscillation by means of incrementally varying collector current, $\Delta I_c$. As the fork 1 oscillates, the voltage induced in pickup coil 5 is applied to base 7 through resistor 10 in series with the forward biasing voltage supplied to base 7. Since resistors 13 and 17 are bypassed by capacitors 15 and 18 the incremental emitter current $\Delta I_e$ that will flow will essentially be the signal voltage applied from pickup coil 5, divided by the total effective A.C. resistance in the emitter circuit in series between the source of signal voltage and the point of reference potential. This total emitter circuit resistance to an A.C. signal can be shown to be equal to $$\text{Emitter resistance} = \frac{R_{10}}{\beta} + R_{df} + R_{16} \tag{1}$$

where $R_{10}$ is the resistance of resistor 10, $R_{16}$ the resistance of the resistor 16 and $R_{df}$ the inherent resistance of the forward biased base emitter diode.

$R_{df}$, which is shown in the dotted circle of FIG. 1, is the inherent internal incremental resistance of the forward biased base-emitter diode and appears due to the imperfection of the negative resistance characteristic of the forward diode. Actual ohmic values of $R_{df}$ depend upon the type of transistor used, temperature, emitter current, and are comparable to input impedance values given for common base operation "transistor ratings." It has been found that $R_{df}$ usually decreases with decreasing temperatures and increasing emitter current and is somewhat less for germanium than for silicon transistors. $\beta$ is conventionally defined as the base-collector current amplification.

The incremental emitter current $\Delta I_e$ is actually the incremental collector current $\Delta I_c$, since the emitter current is the sum of the base and collector currents and the base current is very small. An incremental signal appearing at pickup coil 5 will produce an incremental collector current $\Delta I_c$, which is supplied to drive coil 4, capable of producing a larger output voltage from tuning fork 1 than the initial incremental signal present at pickup coil 5. This regenerative effect will be limited by those components in the collector circuit at the value of collector current $I_c$ necessary for proper drive of the fork 1.

Effectively, the transistor 6 operates as a switch in the current path of drive coil 4. The base 7 and collector 8 of the transistor 6 are biased in such a fashion that any positive voltage present on the base 7 of the transistor 6 will make the transistor 6 conduct and drive it toward a saturated condition. When the positive voltage occurs and the transistor 6 is in a conducting or "on" state the resistance between the emitter 9 and the collector 8 is extremely low, in the order of 150 ohms, depending upon the type of transistor used. The transistor 6 can effectively be considered a diode when the saturated condition is reached.

The functioning of transistor 6 as a switch will be seen from the following description. When tuning fork 1 has reached its normal operating condition, as determined by the circuit constants in the collector circuit, a signal will appear on pickup coil 5 of sufficient amplitude to drive the transistor 6 to a saturated condition on the positive half cycle of the signal and cut transistor 6 off on the negative half cycle of the signal. When a positive signal is applied to base 7, the collector current $I_c$ will increase and the voltage from collector to base $V_{cb}$ will initially fall to zero. When the collector 8 saturates, the collector voltage $V_c$ will fall to the value of the emitter voltage $V_e$. Total current available to supply the drive coil can now be seen to be equal to $$\text{drive current} = \frac{B+ - V_e}{R_4 + R_{14} + R_6} \quad (2)$$

where $V_e$ is the voltage between the emitter electrode 9 and the point of reference potential, $R_4$ is the D.C. resistance of drive coil 4, $R_{14}$ is the resistance of resistor 14 and $R_6$ is the "on" resistance of transistor 6.

When the negative signal is applied to the base 7 of transistor 6 the transistor will be "off," i.e. non-conducting, and the collector current will be equal to zero. The operation of the switch is shown schematically in FIGURE 2, which is not drawn to scale. In this figure, waveform A represents the value of current flowing in the collector circuit and the drive coil. The "on" value of this current is shown by the horizontal portion of square wave A appearing above the reference line C and is determined as previously discussed. The "off" value of the current is zero and is shown by that horizontal portion of the square wave which is below the reference line C. Waveform B shows the actual fork motion which lags the drive current by 90 degrees. As the tuning fork 1 reaches one end of its excursion, as shown by the maximum point of waveform B, the switch goes from an "on" condition to an "off" condition. The switch stays "off" until the fork reaches the other end of its excursion and then at the instant of zero velocity, the minimum point of waveform B, the switch condition is reversed from an "off" to an "on" condition. In this manner, current is supplied to the drive coil 4 in proper phase thereby eliminating any change of output frequency of the tuning fork. The average value of the drive current is designated by base line C and for the simple case of the square wave is equal to one-half the peak-to-peak current of the wave. In practice, the quiescent collector current of the circuit is chosen to equal the average value C. The quiescent collector current is only important for starting purposes and once transistor 6 is in operation its has no significance. Tuning fork 1 is of extremely high Q and therefore the fork will only respond to the fundamental current component, designated as D, of the many harmonics which compose the square wave current component A. The effective current that is utilized to drive the tuning fork 1 is the R.M.S. value of the peak of the fundamental sine wave current component D or, in equation form $$\text{R.M.S.} = \frac{1}{1.41} \times \text{peak value} \quad (3)$$

The "on" resistance of transistor 6 is only a small fraction of the total collector circuit resistance. Therefore, the drive current becomes primarily a function of the B+ voltage divided by the total resistance of the collector circuit, namely the D.C. resistance of the drive coil 4 and resistor 14, and will remain essentially constant despite variations in the transistor characteristics.

As previously stated, the perfect driver circuit would be one which is free from any phase shift. The circuit shown in FIGURE 1 attains this goal by proper choice of components in the emitter and the collector circuits. The A.C. impedance of the emitter circuit can be shown to be $$\text{A.C. impedance of emitter circuit} = X_{C15} + X_{C18} + \frac{R_{10}}{\beta} + R_{16} \quad (4)$$

where $X_{C15}$ and $X_{C18}$ is the capacitive reactance of capacitors 15 and 18 respectively, $R_{10}$ is the resistance of resistor 10, and $R_{16}$ is the resistance of resistor 16. If the series reactance of capacitors 15 and 18, at the operating frequency, is made small with respect to the total emitter resistance, by a suitable choice of capacitors, the phase of the emitter current will lead the fork voltage at base 7 by only a small amount. Inherently present in transistor 6 is a collector-base capacity $C_c$ (shown dotted in FIGURE 1). This capacitor is multiplied by the A.C. voltage gain of the transistor (similar to the "Miller effect"), and appears across resistor 14 in series with the resistance of drive coil 4. It should be noted that an increase in the value of resistor 16 will decrease the A.C. voltage gain, since unbypassed resistor 16 has a degenerative effect to an A.C. signal. A lagging effect will thus be introduced in the collector circuit and upon proper choice of components the collector lag can be made to compensate for the emitter lead.

Thus it is seen, that the oscillator circuit of the invention shown in FIG. 1 functions to supply drive current to drive coil 4 at the proper amplitude and proper phase. This will sustain oscillation of tuning fork 1 at the natural resonant frequency of the fork and will assure that the frequency of oscillation of the fork will not drift.

The embodiment shown in FIGURE 1 is recommended for operating tuning forks at frequencies of 700 cycles per second or lower. This is due to the relatively low impedance input of the common emitter single transistor driver 6 and the consequent loading effect upon the tuning fork 1. The loading effect becomes increasingly detrimental at frequencies above 700 cycles per second. FIGURE 3 shows a two-transistor circuit which is more satisfactory at higher frequencies due to the higher input impedance resulting from the use of an additional amplifier stage 19 connected as an emitter follower.

Referring to FIGURE 3 those components which are used in the same manner as in FIGURE 1 have been designated with the same reference characters. In FIGURE 3 and the subsequent figures to be described, both $R_{df}$ and $C_c$ have been omitted. These two elements, as previously explained, are inherent in all transistors and their effect on the operation of the circuits to be described is the same as that shown in the circuit of FIG. 1. Referring now to FIG. 3, the base 22 of emitter follower transistor 19 is directly coupled to the pickup coil 5 and the collector 20 is connected directly to the B+ supply. The emitter 21 is connected to a point of reference potential through resistor 23. The output of the circuit is taken off across resistor 23 to ground over lead 24. The output of transistor 19 is also coupled from the emitter 21 through the resistor 10 to base 7 of driver transistor 6. From this point, the operation is the same as in the circuit described with reference to FIGURE 1. In addition, a capacitor 25 of small value is connected between the base 22 and the point of reference potential. This capacitor serves to bypass all high frequency A.C. currents to ground.

The advantages of the circuit of FIG. 3 are apparent when it is considered that the pickup coil 5 now looks into the high impedance presented by transistor 19. This negates any loading effect on the pickup coil and allows the circuit to operate at higher frequencies. Utilizing this circuit to generate frequencies above 700 cycles per second, a sine wave output of good quality and low harmonic distortion can be obtained.

It should be noted that the feedback circuit to drive coil 4 operates in the same manner in FIGURE 3 as that described in FIGURE 1. Since transistor 19 is operated as an emitter follower the polarity of the voltage appearing at base 7 will be the same as that appearing at base 22 because output voltage appearing between emitter 21 and ground will "follow" that applied to base 22. Therefore it can be seen that transistor 6 in FIGURE 2 will be "on" when a positive signal from pickup coil 5 is received at base 22 of transistor 19.

FIGURE 4 shows a further modification of the tuning fork drive circuit. In this embodiment the signal originates from essentially a low value resistance source, i.e. either the pickup coil 5 itself or else previous amplifiers connected to pickup coil 5, and is applied to the base of transistor 30 by capacitor 27. Transistor 30 is connected as an emitter follower and consequently does not load the previous amplifier or tuning fork 1. The output is taken across the emitter resistor 31′ of transistor 30 and applied to the base 7 of transistor 6 through resistor 10. For increased accuracy of the oscillator circuit, the "zener" diode 31 is provided. Diode 31 has a reverse breakdown characteristic which will cause it to conduct and keep a constant B+ voltage supplied to the circuit regardless of any variations in B+ and thereby keep the drive current from varying. Also provided in the circuit shown in FIGURE 4 is a thermistor 28 in parallel with the resistor 29. It has been found that as temperature increases the forward base-emitter voltage drop $V_{fbe}$, which is determined by the internal base-emitter resistance of the transistor, will decrease and thus cause a consequent rise in the emitter voltage $V_e$. The emitter voltage $V_e$ equals the D.C. voltage applied to the base $V_b$ less $V_{fbe}$. The resistance of thermistor 28 however, decreases with an increase in temperature and thereby reduces the applied D.C. voltage to the base of transistor 30 to compensate for the emitter voltage $V_e$ increase.

The circuit of the invention embodied in FIG. 4, therefore provides several advantages and refinements over the one shown in FIG. 1. Namely, variations in $V_{fbe}$ with changes in temperature are compensated for by means of thermistor 28 and fluctuations in the B+ supply voltage are regulated by the action of diode 31. This circuit is capable of great accuracy in the reproduction of a specified frequency since the compensating and regulating elements (thermistor and diode) keep two of the essential circuit parameters substantially constant. In addition, the circuit of FIG. 4 is capable of operating at a high frequency since the tuning fork 1 feeds a high impedance load and is therefore not excessively loaded.

Figure 5:
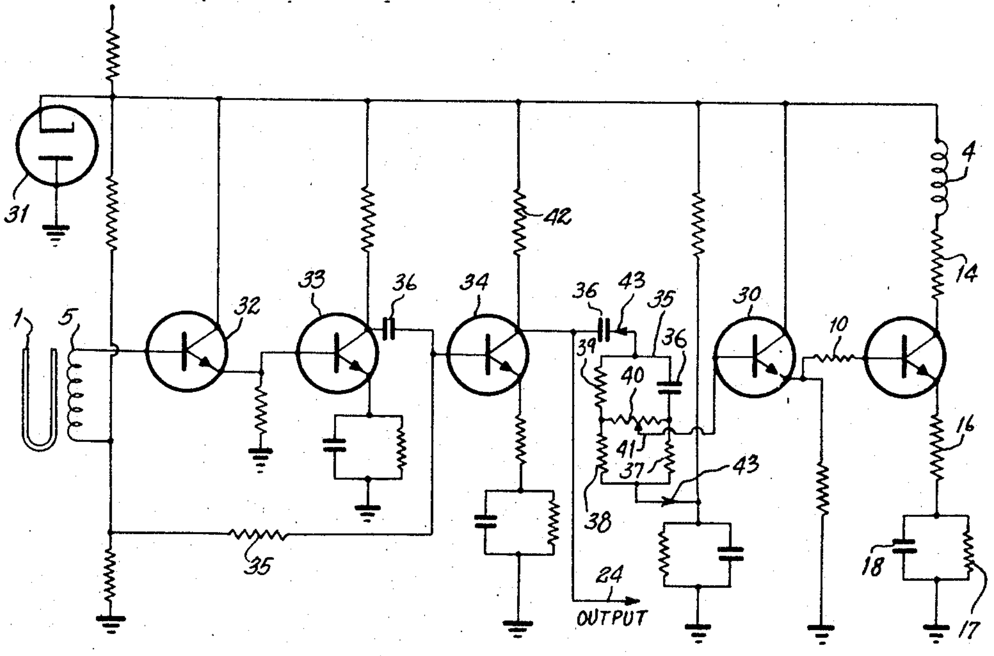
FIG. 5 shows a complete amplifier and driver system.

FIGURE 5 shows another embodiment of the invention which is capable not only of producing extremely accurate results but also can vary the output frequency of the tuning fork resonator. In this embodiment, transistors 32, 33 and 34 function as a three-stage amplifier. Transistor 32 is connected as an emitter follower and with its resulting high impedance input does not load the pickup coil 5. A negative feedback path via resistor 35′ is provided between the collector of transistor 33 and the base of transistor 32 to insure that there will be no phase shift between these two stages. The negative feedback also increases the input resistance of transistor 32. Transistor 34 is connected to transistor 33 to provide additional amplification of the output signal from pickup coil 5. Connected between the output of transistor 34 and the driver circuit composed of transistors 30 and 6 is a variable phase shifting network generally designated as 35. The components 36, 37, 38, 39 and 40 of phase shift network 35 are connected to provide a leading phase in accordance with the position of slider arm 41 on resistor 40.

FIG. 5*a* shows another type of phase shift network that can be used in place of the one shown in FIG. 5. In this network, which is connected in FIG. 5 where shown by the arrow-heads 43, resistor 38 has been replaced by capacitor 52, the other elements remaining the same. As slider arm 41 is now varied, network 35 will be capable of introducing both a leading and a lagging phase shift into the circuit.

In effect, the phase shift network 35 is substantially in parallel with the output resistance 42 of the collector of transistor 34. Slider arm 41 of phase shift network 35 is directly connected to the base of transistor 30. When phase shift network 35 is adjusted to produce a lagging phase shift, the frequency of the fork will be lowered, as previously explained. When network 35 is adjusted to produce a leading phase shift the frequency of the fork will increase. The remainder of the circuit comprising transistors 30 and 6 function in the manner manner as the drive circuits previously described in FIGURE 1 and FIGURE 4.

It should also be noted that the refinements shown in FIGURES 4 and 5 can be used with the other embodiments of this invention. For example, the compensation produced by thermistor 28 for a change in $V_{fbe}$ or the use of zener diode 31 to compensate for any variation in B+ or also the addition of adjustable phase shift network 35 could be suitably applied to the embodiments shown in FIGURES 1 and 3, or in any other interchangeable combination.

The invention is not to be limited to the specific circuits shown and described since the circuits shown are intended only to be illustrative of the principles of the invention. Other modifications of the construction of the circuits may be made within the scope of the invention.

What is claimed is:

1. An oscillator circuit comprising a tuning fork, a source of current, first means for driving said tuning fork, second means for detecting the resulting energy of said tuning fork, a semi-conductor device having input and output electrodes connected between the source of current and the drive means, means connecting said detecting means to said input electrode, a direct current connection between said output electrode and said drive means including a resistor, and means connected to said semi-conductor to make it conductive in response to only selected portions of the resulting energy and produce a substantially square output current waveform which is applied to said drive means.

2. An oscillator circuit for a tuning fork as set forth in claim 1 wherein said direct current connection comprises a resistor of a resistance having a high value as compared to the resistance of the semi-conductor device in a conducting state.

3. An oscillator circuit comprising a tuning fork, drive means for supplying energy to oscillate said tuning fork, means for detecting the resulting energy of said tuning fork, a multi-element semi-conductor device having base, collector and emitter electrodes, means including a resistor connecting said collector electrode to said drive means and providing a direct current path therebetween, means connected to said semi-conductor to make it conduct in response to selected portions of the resulting energy and produce a substantially square output current waveform at its collector electrode, and phase compensating means including said resistor connected to said emitter and collector electrodes to make the phase of the current at the collector electrode to lead the motion of the fork as it oscillates by 90°.

4. An oscillator circuit comprising a tuning fork, a drive coil for supplying energy to oscillate said tuning fork, a pickup coil for detecting the resulting energy from said tuning fork, a multi-element semi-conductor device having base, collector, and emitter electrodes, means connecting said pickup coil to said base electrode, means connected to said semi-conductor to make it conduct in response to selected portions of the resulting energy and produce a substantially square output current waveform at said collector electrode, a resistor high in value in comparison with the resistance of the conducting semi-conductor forming a direct current connection between said collector electrode and said drive coil, and phase compensating means including said resistor connected to said emitter and collector electrodes to make the phase of the current at the collector electrode to lead the motion of the fork as it oscillates by 90°.

5. An oscillator circuit comprising a tuning fork, drive means for supplying energy to oscillate said tuning fork, means for detecting the resulting energy of said tuning fork, a multi-element semi-conductor device having base, collector and emitter electrodes, means connecting said detecting means to said base electrode, means including a resistor connecting said collector electrode to said drive means and providing a direct current path therebetween, and means connected to said semi-conductor to make it conduct in response to selected portions of the resulting energy and produce a substantially square output current waveform at its collector electrode.

6. An oscillator circuit comprising a tuning fork, a drive coil for supplying energy to oscillate said tuning fork, a pickup coil for detecting the resulting energy from said tuning fork, a multi-element semi-conductor device having base, collector, and emitter electrodes, means connecting said pickup coil to said base electrode, biasing means connected to said semi-conductor to make it conduct in response to selected portions of the resulting energy and produce a substantially square output current waveform at said collector electrode, and a resistor high in value in comparison with the resistance of the conducting semi-conductor forming a direct current connection between said collector electrode and said drive coil.

References Cited in the file of this patent

UNITED STATES PATENTS

| | | |
|---|---|---|
| 2,300,271 | Whitaker | Oct. 27, 1942 |
| 2,346,984 | Mead | Apr. 18, 1944 |
| 2,706,785 | Volz | Apr. 19, 1955 |
| 2,777,950 | Doremus | Jan. 15, 1957 |
| 2,797,328 | Miller | June 25, 1957 |

OTHER REFERENCES

"Transistor Circuit Handbook," by Garner, page 90, 1956, published by Coyne Elect. School, Chicago 12.

"Fork-Driven Dual Tone Standard," by Kretzman in Electronics, Feb. 1, 1957, pages 196, 198, 200, 202, 204.